United States Patent

Ziemek et al.

[11] Patent Number: 5,143,897
[45] Date of Patent: Sep. 1, 1992

[54] FLEXIBLE, HIGH TEMPERATURE SUPERCONDUCTIVE CABLES

[75] Inventors: Gerhard B. Ziemek, Langenhagen, Fed. Rep. of Germany; Izyaslav G. Peshkov, Moskau, U.S.S.R.; Grigorij Svalov, Moskau, U.S.S.R.; Victor E. Sytnikov, Moskau, U.S.S.R.; Valerij A. Mitrochin, Moskau, U.S.S.R.

[73] Assignee: Kabelmetal Electro GmbH, Hanover, Fed. Rep. of Germany

[21] Appl. No.: 653,894

[22] Filed: Feb. 12, 1991

[30] Foreign Application Priority Data

Feb. 27, 1990 [DE] Fed. Rep. of Germany ....... 4006094

[51] Int. Cl.$^5$ ............................................. H01L 38/24
[52] U.S. Cl. ........................................... 505/1; 29/599; 228/151; 228/155; 228/173.4; 228/173.5
[58] Field of Search ...................... 29/599; 505/1, 917, 505/921, 928, 929, 930; 228/147, 151, 155, 173.5, 173.4

[56] References Cited

U.S. PATENT DOCUMENTS

| | | | |
|---|---|---|---|
| 3,077,661 | 2/1963 | Fromson | 228/155 X |
| 3,783,503 | 1/1974 | Diepers et al. | 505/928 X |
| 3,873,799 | 3/1975 | Scheffler et al. | 28/599 X |
| 4,397,081 | 8/1983 | Ziemek et al. | 29/599 |
| 4,447,946 | 5/1984 | Marancik | 505/921 X |

Primary Examiner—Joseph M. Gorski
Attorney, Agent, or Firm—James C. Jangarathis

[57] ABSTRACT

Method of manufacturing a flexible, high temperature superconductive cable by longitudinally imbedding a ceramic oxide material in a band source material, and then compressing same to form an elongated flat band, which in turn is deformed into a hollow tubular member whose longitudinal edges are welded before such member is corrugated. Further, there is disclosed a flexible, high temperature superconductive cable including a corrugated metallic wall having imbedded therein at least one superconductor of ceramic oxide material extending continuously therethrough.

6 Claims, 2 Drawing Sheets

FLEXIBLE, HIGH TEMPERATURE SUPERCONDUCTIVE CABLES

The invention relates to the method of manufacturing a flexible, high temperature superconductive cable including at least one longitudinally extending superconductor of ceramic oxide material having high temperature, superconductive characteristics; and further, to the structure of such cables.

BACKGROUND OF THE INVENTION

Ceramic oxide materials having high temperature, superconductive characteristics are priorly known as those materials whose transition to superconduction occur at temperatures of 100° Kelvin and above. Although it has been priorly suggested to apply a thin layer of such materials comprised of mixed oxides of yttrium, barium and copper to the surfaces of copper wires, the brittle and inflexible characteristics of such layers have resulted in unacceptable mechanical damage in the manufacture and use of cables including wires so covered.

OBJECT OF THE INVENTION

An object of the present invention is to provide a novel method for manufacturing high temperature superconductors comprised of thin layers or strands of the aforesaid ceramic oxide materials in continuous extensive lengths imbedded inside the metallic wall of a highly flexible, tubular member.

A further object of the present invention is to imbed such high temperature superconductors in an elongated metallic member, such as copper, for example, that may function as a conventional conductor in the instance of a failure of the surrounding cooling system to maintain a superconductive transition temperature.

Another object of the present invention is to provide an elongated highly flexible, tubular member having imbedded therein a plurality of superconductors comprised of thin layers or strands of the aforesaid ceramic oxide materials, which are distributed radially about the circumference of the tubular member, and/or distributed at different levels within the wall of the tubular member for minimizing transmission interferences; reducing power density under operating conditions; and increasing mechanical stability of the wall proper.

SUMMARY OF THE INVENTION

These and other objects of the present invention are achieved by a novel method of manufacturing a flexible, high temperature superconductive cable by the steps of longitudinally imbedding a priorly known ceramic oxide material having high temperature, superconductive characteristics in a band source member of metallic material; compressing by a rolling process the band source member and the imbedded ceramic oxide material into an elongated flat band; deforming the elongated flat band into a hollow tubular member; welding the longitudinal adjacent edges of the hollow tubular member; and then corrugating the welded tubular member. Further, such objects are achieved by a flexible, high temperature superconductive cable which comprises a hollow tubular member including a corrugated metallic wall having imbedded therein at least one continuously extending, high temperature superconductor.

BRIEF DESCRIPTION OF THE DRAWINGS

A better understanding of the invention as well as the objects and advantages thereof will become apparent upon consideration of the following detailed disclosure thereof, especially when taken with the accompanying drawings, wherein:

Referring to FIGS. 1-3, there is depicted a cylindrical, band source member 1 comprised of copper and having a central aperture 2 extending therethrough. The aperture 2 is filled with a conventional ceramic oxide 2 having high temperature, superconductive characteristics. The band source member 1 is of relatively short length and is deformed into an elongated flat band 4 by the employment of conventional rolling techniques. As a result of such deformation, the ceramic oxide 3 is compressed into a flat cross-section between the encompassing copper material of the flat band 4, and is extended continuously in length to that of the elongated flat band 4. The length of the flat band 4 is dependent upon the original dimensions of the band source member As is priorly known for the manufacture of hollow tubular members (for example, wave guides and cable sheaths), the flat band 4 is formed into a corrugated, hollow tubular member 9 by the steps of drawing the flat band 4 in a longitudinal direction through a plurality of forming rolls to form a hollow tubular member 5; continuously welding longitudinal abutting edges 6 and 7 of the hollow tubular member to form a longitudinal weld seam 8; and continuously corrugating the welded hollow tubular member 5 to provide helical corrugations, or ring corrugations wherein the corrugations form wave crests and valleys disposed parallel with respect to each other. The corrugated, hollow tubular member 9 has the mechanical characteristics of being highly flexible because of its corrugations, while providing a protected environment for the imbedded ceramic oxide 3 within the flattened copper material of the tubular member 9.

Referring to FIGS. 4 and 5, there is depicted a rectangular, band source member 40 of copper material which includes a plurality of parallel bores 10 spatially separated from each other. The bores 10 are each filled with a conventional ceramic oxide 11 having high temperature, superconductive characteristics. The rectangular, band source member 40 is deformed into an elongated, flat band 12 by the employment of conventional rolling techniques. As a result of such deformation, the bores 10 containing the ceramic oxide 11 are compressed into extended apertures 13 within the flat band 12 that include the ceramic oxide configured as continuously extending, wire like members encompassed by the copper material of the flat band 12. As in the case of the aforesaid described elongated flat band 4, the elongated flat band 12 is formed into a hollow tubular member, continuously welded and then corrugated to provide a corrugated, hollow tubular member that is to be employed as a flexible superconductive cable.

FIG. 6 depicts a band source member 14 which is comprised of a base member 41 of copper material having a plurality of longitudinally extending grooves 15. The grooves 15 are each filled with a conventional ceramic oxide 16 having high temperature, superconductive characteristics, and then are covered by a plate 17 which extends across the grooved face of the base member 41. The plate 17 is fixedly attached to the base member 41 by, for example, welding or soldering. The plate 17 is also comprised of copper material. Alternatively, the plate 17 may be comprised of silver, and the surfaces of the grooves 15 may also be coated with a silver coating 18 in view of the oxygen permeability of such material. The multiple layered, band source member 14 is then compressed into an elongated flat band (not shown) in a manner as heretofore described with respect to bands 4 and 12, thus forming a thin band of ceramic oxide within an elongated flat band; and then formed into a corrugated, hollow tubular member in a manner as heretofore described with respect to corrugated, hollow tubular member 9. The resulting corrugated hollow tubular member, like the corrugated, hollow tubular member 9, includes the ceramic oxide material as continuously extending superconductors imbedded in the wall thereof. Such a corrugated, hollow tubular member can be bent and processed with the customary procedures and finishing machines, and finally wound onto drums and installed in the manner of customary cables, without the interruption or fracture of the longitudinally extending superconductors.

Figure 1:
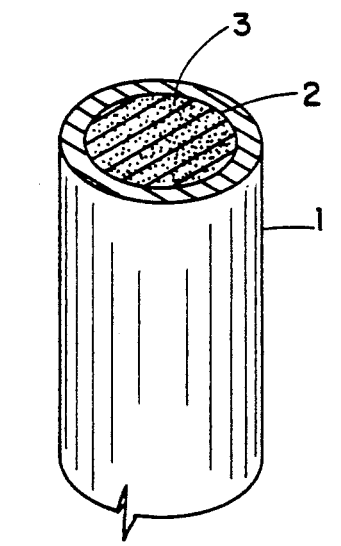
FIG. 1 is a representation of a cylindrical, band source member having a central aperture filled with a ceramic oxide.
Figure 2:
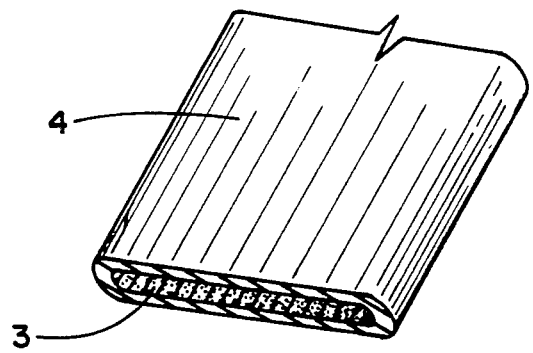
FIG. 2 is a representation of f the band source member of FIG. 1 deformed into an elongated flat band.
Figure 3:
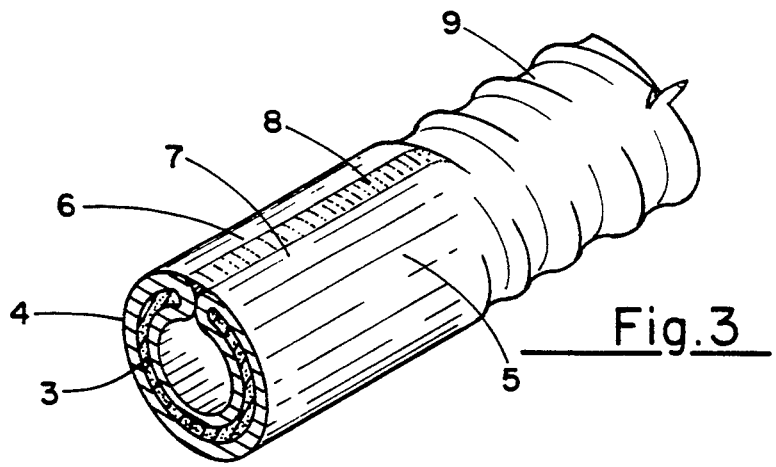
FIG. 3 is a representation of the elongated band of FIG. 2 formed into a corrugated, hollow tubular member.
Figure 4:
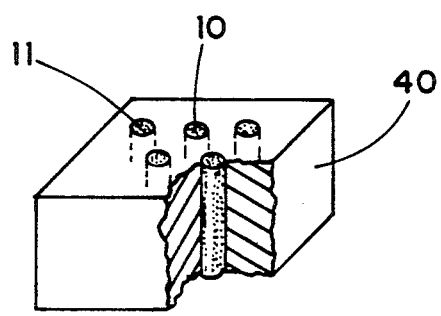
FIG. 4 is a schematic representation of a rectangular, band source member having a plurality of parallel bores filled with a ceramic oxide.
Figure 5:
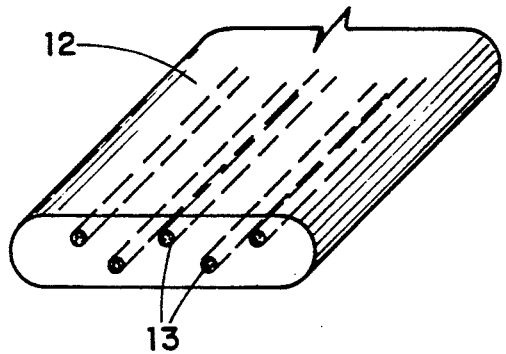
FIG. 5 is a representation of the band source member of FIG. 4 deformed into an elongated, flat band.
Figure 6:
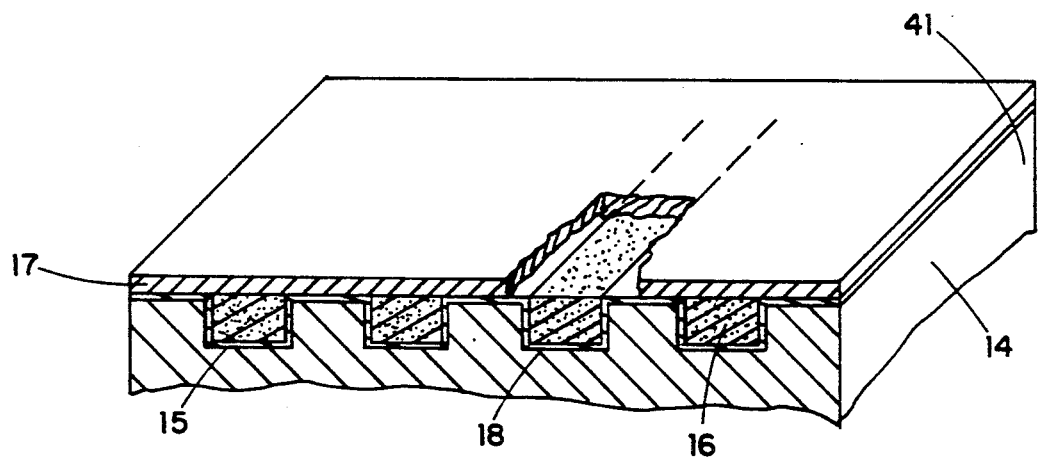
FIG. 6 is a schematic representation of a band source member having a metallic base member including a plurality of longitudinally extending grooves filled with a ceramic oxide, and a cover plate extending thereacross.
Figure 7:
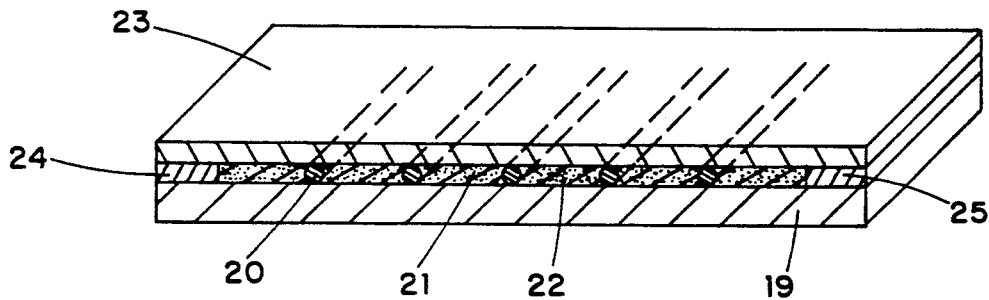
FIG. 7 is a representation of a band source member including a plurality of thin silver wires placed on a base member to define therebetween parallel strip spaces which are filled with a ceramic oxide.

A further band source member 23 appropriate for the manufacture of a corrugated, hollow tubular member that functions as a high temperature, flexible superconductive cable is depicted in FIG. 7. In band source member 23, a plurality of thin silver wires 20 are placed in longitudinal alignment on one surface of a base member 19 of copper material. The thin wires 20 define therebetween parallel strip spaces 21 which are filled with a ceramic oxide 22 having high temperature, superconductive characteristics. A metallic plate 23 is formed above the thin wires 20, and metallic strips 24 and 25 are positioned on opposite sides of thin wires 20 so as to maintain the ceramic oxide 22 within the confines between the member 19 and the metallic plate 23. The base member 19, the metallic strips 24 and 25, and the metallic plate 23 are metallurgically bonded by means, for example, of pressure or explosion welding. Subsequently, the bonded, band source member 23 is subjected to a convention rolling process in the direction of the longitudinally extending silver wires 20 which results in the compression of the ceramic oxide material and the encompassing metallic materials to form an elongated flat band appropriate for further fabrication into a corrugated, hollow tubular member having the compressed ceramic oxide material as longitudinal extending superconductors imbedded in the wall thereof.

Figure 8:
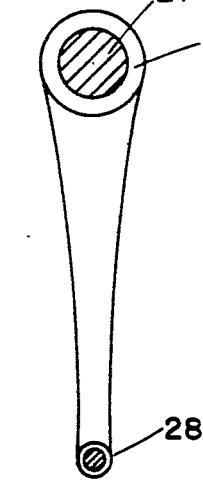
FIG. 8 is a representation of a silver tube having an axial aperture filled with a ceramic oxide, such tube having been drawn down longitudinally so as to have a diminished cross-section.
Figure 9:
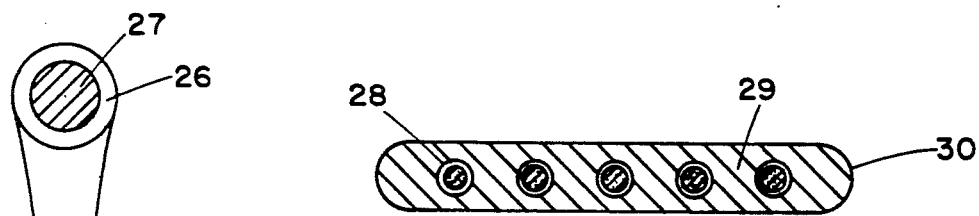
FIG. 9 is a representation of a plurality of silver tubes of a kind represented by FIG. 8, encased with a copper material.

The heretofore described band source members 1, 40, 14 and 23 are fabricated by the incorporation of a ceramic oxide in a base member or combination of members, and rolling same by conventional techniques to form an elongated flat band that is then formed into a corrugated, hollow tubular member that is employed as a flexible, high temperature superconductive cable. In deviation therefrom, FIGS. 8 and 9 are directed to a method of fabricating an elongated flat band (not shown) with the employment of self-supporting strands 28 of superconductive material. FIG. 8 is a diagrammatic representation of an elongated silver tube 26 the axial aperture of which has been filled with a ceramic oxide 27 having high temperature, superconductive characteristics. The filled silver tube 26 is reduced by a conventional draw down process until it has a diminished cross-section as represented by the end of a self-supporting, superconducting strand 28. A plurality of the superconducting strands 28 are then aligned in parallel to each other in one plane and then encased with a copper casing 29 (FIG. 9). The formation of the casing 29 employs electrolyte based procedures or a casting process. The self-supporting strands 28 are protectively retained in the encompassing copper casing 29 during a subsequent rolling step which results in the compression of the ceramic oxide particles within the compressed silver tubes 26, while the cross-section of the copper casing 29, which is the total profile of a band source member 30, is reduced to that of an elongated, flat band that is then fabricated into a corrugated, hollow tubular member that is a flexible, high temperature superconductive cable.

Figure 10:
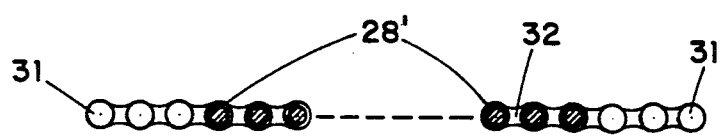
FIG. 10 is a representation of a plurality of self-supporting, superconducting strands aligned in proximity to each other, with additional end strands comprised of a metallic material, and a copper carrier formed between various strands.

FIG. 10 depicts an alternative method of employing the self-supporting strands in the fabrication of an elongated flat band including compressed, superconducting strands 28. In this method, a plurality of the self-supporting, superconducting strands 28' are aligned in proximity to each other in one plane, but the end strands 31 is comprised solely of metallic material, such as copper or silver, so as to assure elongated edge areas fee of ceramic oxide particles, thus attending to the requirements that the elongated flat band to be formed therefrom will have longitudinal edges that are readily weldable. A copper carrier 32 is formed by electrolyte based procedures between the various adjacent strands 28' and 32, to maintain the unity of the plurality strands, during the subsequent step of compressing same into an elongated flat band.

While the invention has been described in connection with exemplary embodiments thereof, it will be understood that many modifications will be apparent to those of ordinary skill in the art and that this application is intended to cover any adaptions or variations thereof. Therefore, it is manifestly intended that the invention be only limited by the claims and equivalents thereof.

What is claimed:

1. A method of manufacturing a flexible, high temperature superconductive cable, comprising the steps of:

longitudinally imbedding a ceramic oxide material having high temperature, superconductive characteristics in a band source member of metallic material thereby encasing longitudinal surfaces of said ceramic oxide material in said metallic material;

compressing by a rolling process said band source member and said encased ceramic oxide material into an elongated flat band with the length of said encased ceramic oxide material being extended to the length of said elongated flat band and forming a high temperature superconductor therethrough;

deforming by longitudinal drawing and shaping said elongated flat band into a hollow tubular member;

welding longitudinal adjacent edges of said hollow tubular member; and corrugating said welded, hollow tubular member.

2. Method in accordance with claim 1 wherein said imbedding step includes inserting said ceramic oxide material into a longitudinal central aperture in said band source member.

3. Method in accordance with claim 1, wherein said imbedding step includes inserting said ceramic oxide material into a plurality of parallel bores in said band source member.

4. Method in accordance with claim 1, wherein said imbedding step includes inserting said ceramic oxide material into a plurality of longitudinal extending grooves; said band source material compromising a base member of metallic material that includes said plurality of longitudinally extending grooves, and a plate of metallic material that covers said plurality of grooves and is fixedly attached to said base member.

5. Method in accordance with claim 1, wherein said imbedding step includes inserting said ceramic oxide material into spaces between a pair of metallic strips and a plurality of thin metallic wires; said band source member comprising a base member of metallic material, said plurality of thin metallic wires positioned in longitudinal alignment on one surface of said base member, said pair of metallic strips positioned on opposite sides of said plurality of thin metallic wires, and a metallic plate positioned upon said plurality of thin metallic wires to enclose said ceramic oxide material.

6. Method in accordance with claim 1 wherein said imbedding step includes inserting said ceramic oxide material into central apertures of a plurality of metallic tubes; said band source member comprising said plurality of metallic tubes aligned with each other in a metallic casing.

* * * * *